(12) United States Patent
Han et al.

(10) Patent No.: US 8,766,341 B2
(45) Date of Patent: Jul. 1, 2014

(54) EPITAXIAL GROWTH OF SINGLE CRYSTALLINE MGO ON GERMANIUM

(75) Inventors: Wei Han, Riverside, CA (US); Yi Zhou, Pasadena, CA (US); Kang-Lung Wang, Santa Monica, CA (US); Roland K. Kawakami, Riverside, CA (US)

(73) Assignee: The Regents of the University of California, Oakland, CA (US)

( * ) Notice: Subject to any disclaimer, the term of this patent is extended or adjusted under 35 U.S.C. 154(b) by 387 days.

(21) Appl. No.: 12/905,675

(22) Filed: Oct. 15, 2010

(65) Prior Publication Data

US 2011/0089415 A1    Apr. 21, 2011

Related U.S. Application Data

(60) Provisional application No. 61/253,285, filed on Oct. 20, 2009.

(51) Int. Cl.
H01L 21/02    (2006.01)
H01L 29/10    (2006.01)
H01L 29/12    (2006.01)
H01L 21/00    (2006.01)

(52) U.S. Cl.
USPC .................. 257/295; 257/43; 438/3; 438/765

(58) Field of Classification Search
USPC ............... 438/3, 478–509, 758–794; 257/43; 360/112, 313–328
See application file for complete search history.

(56) References Cited

U.S. PATENT DOCUMENTS

| 5,387,459 | A  * | 2/1995  | Hung .......................... 428/209 |
| 5,514,484 | A  * | 5/1996  | Nashimoto ................... 428/700 |
| 6,214,712 | B1 * | 4/2001  | Norton ......................... 438/591 |
| 6,855,992 | B2 * | 2/2005  | Emrick et al. ................ 257/378 |
| 2001/0006254 | A1 * | 7/2001 | Li ............................... 257/742 |
| 2002/0102418 | A1 * | 8/2002 | Gan et al. .................... 428/450 |
| 2004/0178460 | A1 * | 9/2004 | Lee et al. ..................... 257/421 |
| 2006/0246604 | A1 * | 11/2006 | Bae et al. ......................... 438/1 |
| 2008/0180991 | A1 * | 7/2008 | Wang ........................... 365/171 |
| 2009/0152684 | A1 * | 6/2009 | Wang et al. ................... 257/627 |
| 2009/0180215 | A1 * | 7/2009 | Ishikawa et al. ............. 360/313 |
| 2009/0278218 | A1 * | 11/2009 | Kim ............................. 257/421 |

OTHER PUBLICATIONS

Ahmed et al., "Pulsed Laser Deposited Coatings", Jun. 1993, Materials World, vol. 1, No. 6, pp. 344-345.*
Virginia Semiconductor, Inc., Basic Crystallographic Definitions and Properties of Si, SiGe, and Ge, Jun. 2002.*
Wolf, S.A. et al, "Spintronics: A Spin-Based Electronics Vision for the Future," Science, Nov. 16, 2001, pp. 1488-1495, vol. 294, www.sciencemag.org.
Appelbaum, I. et al, "Electronic measurement and control of spin transport in silicon," Nature, May 17, 2007, pp. 295-298, vol. 447, Nature Publishing Group.
Jonker, B.T. et al, "Electrical spin-injection into silicon from a ferromagnetic metal/tunnel barrier contact," Nature Physics, Aug. 2007, pp. 542-556, vol. 3, Nature Publishing Group.

(Continued)

*Primary Examiner* — Karen Kusumakar
(74) *Attorney, Agent, or Firm* — Withrow & Terranova, P.L.L.C.

(57) ABSTRACT

The embodiments disclosed herein relate to growth of magnesium-oxide on a single crystalline substrate of germanium. The embodiments further describes a method of manufacturing and crystalline structure of a FM/MgO/Ge(001) heterostructure. The embodiments further related to method of manufacturing and a crystalline structure for a high-k dielectric//MgO [100](001)//Ge[110](001) heterostructure.

34 Claims, 8 Drawing Sheets

(56) References Cited

OTHER PUBLICATIONS

Jansen, R., "Silicon takes a spin," Nature Physics, Aug. 2007, pp. 521-522, vol. 3, Nature Publishing Group.

Park, Y.D. et al, "A Group-IV Ferromagnetic Secmiconductor: MnxGe1—x," Science, Jan. 25, 2002, pp. 651-654, vol. 295, www.sciencemag.org.

Cho, S. et al, "Ferromagnetism in Mn-doped Ge," Physical Review B, 2002, pp. 033303-1-033303-3, vol. 66, The American Physical Society.

Tsui, F. et al, "Novel Germanium-Based Magnetic Semiconductors," Physical Review Letters, Oct. 24, 2003, pp. 177203-1-177203-4, vol. 91, No. 17, The American Physical Society.

Schmidt, G. et al, "Fundamental obstacle for electrical spin injection from a ferromagnetic metal into a diffusive semiconductor," Physical Review B, Aug. 15, 2000-II, pp. R4790-R4793.

Rashba, E.I., "Theory of electrical spin injection: Tunnel contacts as a solution of the conductivity mismatch problem," Physical Review B, Dec. 15, 2000-II, pp. R16 267-R16 270, vol. 62, No. 24, The American Physical Society.

Fert, A. et al, "Conditions for efficient spin injection from a ferromagnetic metal into a semiconductor," Physical Review B, 2001, pp. 184420-1-184420-9, vol. 64, The American Physical Society.

Butler, W.H. et al, "Spin-dependent tunneling conductance of Fe|MgO|Fe sandwiches," Physical Review B, 2001, pp. 054416-1-054416-12, vol. 63, The American Physical Society.

Mavropoulos, Ph et al, "Complex Band Structure and Tunneling through Ferromagnet/Insulator/Ferromagnet Junctions," Physical Review Letters, Jul. 31, 2000, pp. 1088-1091, vol. 85, No. 5, The American Physical Society.

Yuasa, S. S et al, "Giant room-temperature magnetoresistance in single-crystal Fe/MgO/Fe magnetic tunnel junctions," Nature Materials, Dec. 2004, pp. 868-871, vol. 3, Nature Publishing Group.

Parkin, S.S.P. et al, "Giant tunneling magnetoresistance at room temperature with MgO (100) tunnel barriers," Nature Materials, Dec. 2004, pp. 862-867, vol. 3, Nature Publishing Group.

Jiang, X. et al, "Highly Spin-Polarized Room-Temperature Tunnel Injector for Semiconductor Spintronics using MgO (100)," Physical Review Letters, Feb. 11, 2005, pp. 056601-1-056601-4, vol. 94, The American Physical Society.

Lu, Y. et al, "MgO thickness dependence of spin injection efficiency in spin-light emitting diodes," Applied Physics Letters, 2008, pp. 152102-1-152102-3, vol. 93, American Institute of Physics.

Zhou, Y. et al, "Alleviation of Fermi-level pinning effect on metal/germanium interface by insertion of ultrathin aluminum oxide," Applied Physics Letters, 2008, pp. 202105-1-202105-3, American Institute of Physics.

Nishimura, T. et al, "A Significant Shift of Schottky Barrier Heights at Strongly Pinned Metal/Germanium Interface by Inserting an Ultra-Thin Insulating Film," Applied Physics Express, 2008, pp. 051406-1-051406-3, The Japan Society of Applied Physics.

Kobayashi, M. et al, "Fermi-Level Depinning in Metal/Ge Schottky Junction and Its Application to Metal Source/Drain Ge MNOSFET," 2008 Symposium on VLSI Technology Digest of Technical Papers, 2008, pp. 54-55, IEEE.

Kaneko, S. et al, "Cubic-on-cubic growth of a MgO(001) thin film prepared on Si(001) substrate at low ambient pressure by the sputtering method," Europhysics Letters, Feb. 2008, pp. 46001-1-46001-5, vol. 81, EPL.

Miao, G.X. et al, "Epitaxial growth of MgO and Fe/MgO/Fe magnetic tunnel junctions on (100)-Si by molecular beam epitaxy," Applied Physics Letters, 2008, pp. 142511-1-142511-3, vol. 93, American Institute of Physics.

Chen, X.Y. et al, "Selective growth of (100)-, (110)-, and (111)-oriented MgO films on Si(100) by pulsed laser deposition," Journal of Applied Physics, May 1, 2002, pp. 5728-5734, vol. 91, No. 9, American Institute of Physics.

Chang, L.D. et al, "Epitaxial MgO buffer layers for YBa2Cu3O7—x thin film on GaAs," Applied Physics Letters, Apr. 6, 1992, pp. 1753-1755, vol. 60, No. 4, American Institute of Physics.

Hung, L.S. et al, "Epitaxial growth of MgO on (100)GaAs using ultrahigh vacuum electron-beam evaporation," Applied Physics Letters, Jun. 22, 1992, pp. 3129-3131, vol. 60, No. 25, American Institute of Physics.

Suleman, M. et al, "Changes in auger spectra of Mg and Fe due to oxidation," Surface Science, 1973, pp. 75-81, vol. 35, North Holland Publishing Co.

* cited by examiner

EPITAXIAL GROWTH OF SINGLE CRYSTALLINE MGO ON GERMANIUM

This application claims the benefit of U.S. Provisional Patent Applications 61/253,285 entitled "Epitaxial Growth of Single Crystalline MGO on Germanium," filed Oct. 20, 2009, the disclosure of which is incorporated herein by reference in its entirety.

The inventions described herein were made with Government support under Grant No. 0450037, awarded by the National Science Foundation. The Government has certain rights in these inventions.

FIELD OF THE DISCLOSURE

This application relates to improved techniques for epitaxial growth of single crystalline magnesium oxide (MgO) on germanium (Ge) and its applications.

BACKGROUND

Semiconductor spintronics aims to add novel functionality to electronic devices by utilizing the spin degree of freedom. Group-IV semiconductors are of particular interest due to the potential compatibility with established silicon technologies, and germanium has shown favorable properties related to magnetic doping. One of the main challenges for germanium-based spintronics is to achieve efficient spin injection from ferromagnetic (FM) metal contacts into germanium. In addition, metal/n-germanium contacts have a strong Fermi level pinning problem.

Accordingly, there is a need to resolve the conductivity mismatch problems of FM/n-Ge contact for spin injection and relieve the problem of strong Fermi level pinning by insertion of an insulator layer between the ferromagnetic metal layer and germanium layer.

SUMMARY OF THE DETAILED DESCRIPTION

Embodiments in the detailed description relate to growth of magnesium-oxide on a single crystalline substrate of germanium (Ge). The detailed description further relates to development of a single crystalline FM/MgO/Ge(001) heterostructure. In addition, the detailed description also relates to development of a high-k dielectric//MgO (001)//Ge[110] (001) heterostructure.

In addition to resolving the conductivity mismatch problem by introducing a tunnel barrier, magnesium-oxide films possess a special spin filtering property based on wave function symmetry that greatly enhances the spin polarization when the ferromagnetic (FM) is body centered cubic $Co_xFe_{1-x}$. The spin polarization may be up to 85 percent.

Furthermore, the magnesium-oxide film may act as a barrier to prevent diffusion of transition metals into the germanium substrate, where the magnesium-oxide acts as a thin insulator. The insertion of a thin layer of an insulator, such as magnesium-oxide, can also alleviate the strong Fermi level pinning problem of metal/n-Ge contacts Likewise, the insertion of a thin layer of magnesium-oxide between a germanium substrate and a high-k dielectric may be used to construct germanium-based MOS FET devices.

In that regard, an example embodiment may include a method for creating a hetero structure. The method may include providing a substrate having a first layer, wherein the first layer includes a substantially single crystalline germanium (Ge). The method further includes placing the substrate into a molecular beam epitaxy chamber and annealing the substrate. The method further includes depositing a second layer onto the substrate by evaporation of a single crystal magnesium-oxide (MgO) source to form the second layer on the substrate, wherein the second layer includes a substantially single crystalline magnesium-oxide.

Another example embodiment includes a product made by a process. The process may include providing a substantially single crystalline germanium substrate. The process may further include cleaning the substantially single crystalline germanium substrate and placing the substantially single crystalline germanium substrate into a molecular beam epitaxy chamber. Thereafter, the process may include annealing the substantially single crystalline germanium substrate. The process may also include depositing a magnesium-oxide layer onto the substantially single crystalline germanium substrate by molecular beam epitaxy with a substantially single crystalline magnesium-oxide source, wherein magnesium-oxide of the magnesium-oxide layer is (001) oriented and a magnesium-oxide unit cell has a 45° in-plane rotation with respect to a unit cell of germanium (001) in the substantially single crystalline germanium substrate.

Still another example embodiment is a semiconductor wafer including a substantially single crystalline germanium substrate (001). In addition, the semiconductor wafer may further include a substantially single crystalline magnesium-oxide layer (001) disposed on the substantially single crystalline germanium substrate, wherein a unit cell of the substantially single crystalline magnesium-oxide layer is rotated 45 degrees with respect to a unit cell of the substantially single crystalline germanium substrate.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 1(a)-(d) depict an example of the stages for an epitaxially grown MgO/Ge structure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Semiconductor spintronics aims to add novel functionality to electronic devices by utilizing the spin degree of freedom. Group-IV semiconductors are of particular interest due to the potential compatibility with established silicon technologies. In particular, germanium has favorable properties related to magnetic doping.

One of the main challenges for germanium-based spintronics is to achieve efficient spin injection from ferromagnetic (FM) metal contacts into germanium. An example ferromagnetic material is iron.

A promising avenue is to develop single crystalline FM/MgO/Ge(001) heterostructures. Likewise, the insertion of a thin layer of magnesium-oxide between a germanium substrate and a high-k dielectric may be used to construct germanium based MOS FET devices.

Embodiments in the detailed description relate to growth of magnesium-oxide (MgO) on a single crystalline substrate of germanium (001). The detailed description further relates to development of a single crystalline FM/MgO/Ge(001) heterostructure. In addition, the detailed description also relates to development of a high-k dielectric//MgO [100](001)//Ge (001)[110](001) heterostructure.

In addition to resolving the conductivity mismatch problem by introducing a tunnel barrier, magnesium-oxide (001) films possess a special spin filtering property based on wave function symmetry that greatly enhances the spin polarization when the ferromagnetic (FM) is body centered cubic $Co_xFe_{1-x}$. The spin polarization may be up to 85 percent.

Furthermore, the magnesium-oxide film may act as a barrier to prevent diffusion of transition metals into the germanium substrate, where the magnesium-oxide acts as a thin insulator. The insertion of a thin layer of insulator, such as magnesium-oxide, can also alleviate the strong Fermi level pinning problem of metal/n-Ge contacts Likewise, the insertion of a thin layer of magnesium-oxide between a germanium substrate and a high-k dielectric may be used to construct germanium MOS FET devices.

In that regard, an example embodiment includes a method for creating a heterostructure. The method includes providing a substrate having a first layer, wherein the first layer includes a substantially single crystalline germanium (Ge). The method further includes placing the substrate into a molecular beam epitaxy chamber and annealing the substrate. The method further includes depositing a second layer onto the substrate by evaporation of a single crystal magnesium-oxide (MgO) source to form the second layer on the substrate, wherein the second layer includes a substantially single crystalline magnesium-oxide.

Another example embodiment includes a product made by a process. The process may include providing a substantially single crystalline germanium substrate. The process may further include cleaning the substantially single crystalline germanium substrate and placing the substantially single crystalline germanium substrate into a molecular beam epitaxy chamber. Thereafter, the process may include annealing the substantially single crystalline germanium substrate. The process may also include depositing a magnesium-oxide layer onto the substantially single crystalline germanium substrate by molecular beam epitaxy with a substantially single crystalline magnesium-oxide source, wherein magnesium-oxide of the magnesium-oxide layer is (001) oriented and a magnesium-oxide unit cell has a 45° in-plane rotation with respect to a unit cell of germanium (001) in the substantially single crystalline germanium substrate.

Figure 1A:
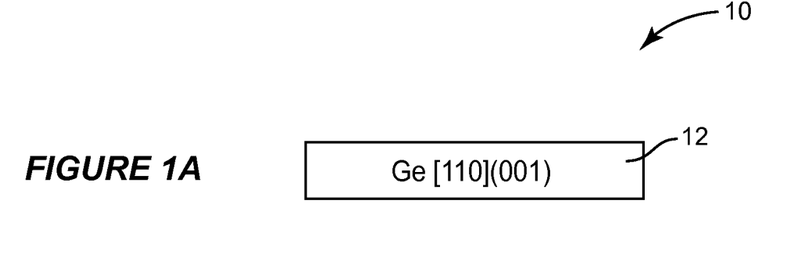
Figure 2:
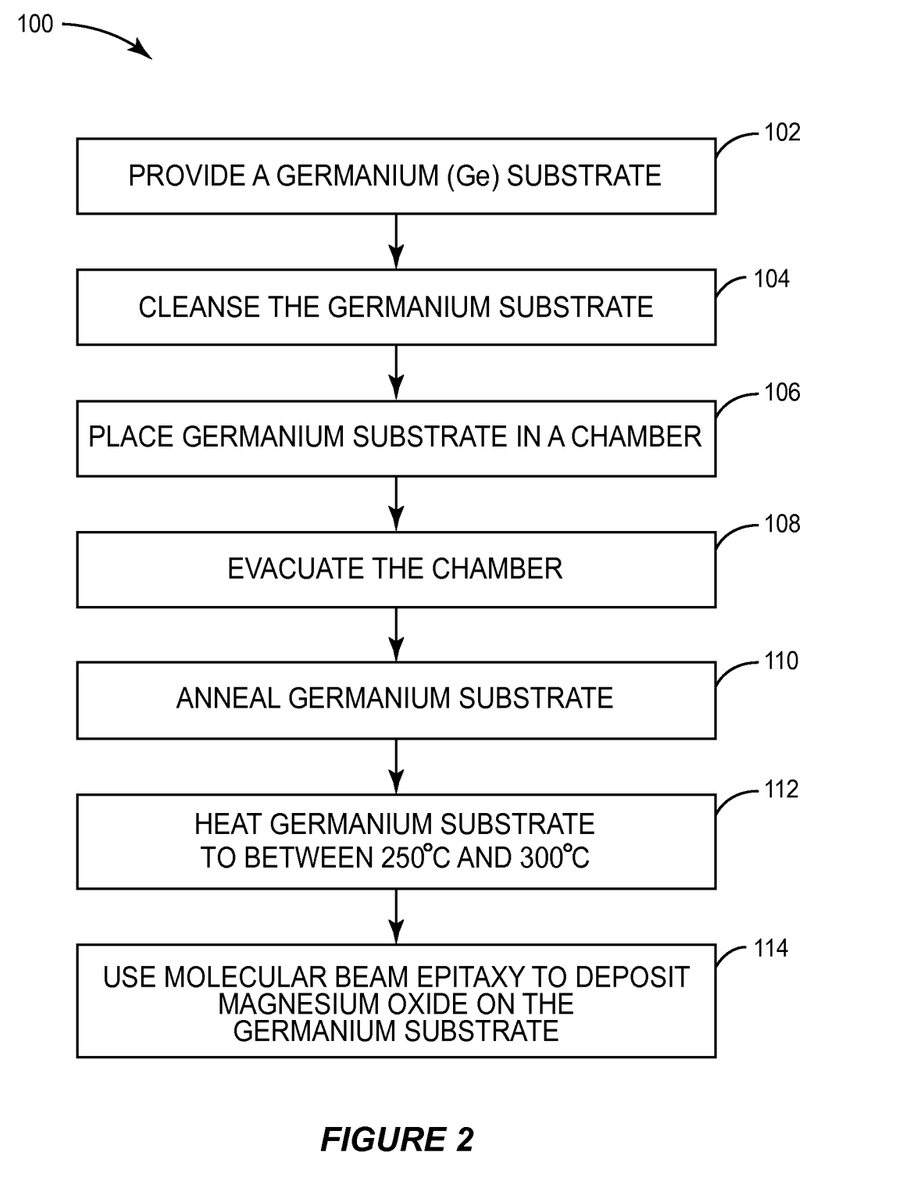
FIG. 2 depicts an example operation to epitaxially grow MgO[100](001)//Ge [110](001) by molecular beam epitaxy.

Still another example embodiment is a semiconductor wafer including a substantially single crystalline germanium substrate (001). In addition, the semiconductor wafer may further include a substantially single crystalline magnesium-oxide layer (001) disposed on the substantially single crystalline germanium substrate, wherein a unit cell of the substantially single crystalline magnesium-oxide layer is rotated 45 degrees with respect to a unit cell of the substantially single crystalline germanium substrate FIGS. 1(A)-(F) depict the stages of growth of an epitaxially grown FE/MgO/Ge junction having an outer protective lay of aluminum. FIG. 2 depicts an operation 100 to epitaxially grow an FE/MgO/Ge junction that possesses a single crystalline order and atomically smooth morphology, with continuing reference to the crystalline structure 10 depicted in FIG. 1(A)-(F).

Figure 1B:
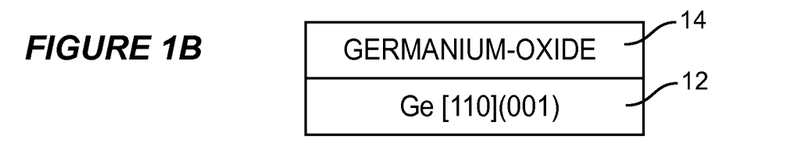

First, a germanium substrate from a single crystal is provided. (Act 102.) The germanium substrate 12 has Miller index (100). Before placing the germanium substrate into a molecular beam epitaxy chamber, the germanium substrate 12 is cleaned. (Act 104.) The germanium substrate 12 may be initially cleaned with isopropyl alcohol. Thereafter, the germanium substrate 12 may be cleaned by subsequent washings with $NH_4OH_4$, $H_2SO_4$, $H_2O_2$. The interaction of the germanium with the $H_2O_2$ produces a germanium oxide layer 14 on the surface of the germanium substrate, as depicted in FIG. 1(B).

The cleaned germanium substrate 12 is place in the molecular beam epitaxy chamber. The molecular beam epitaxy chamber is evacuated to form a vacuum in the chamber. (Act 106) As an example, the vacuum may be an ultra high vacuum of $1\times10^{-10}$ torr.

Figure 1C:
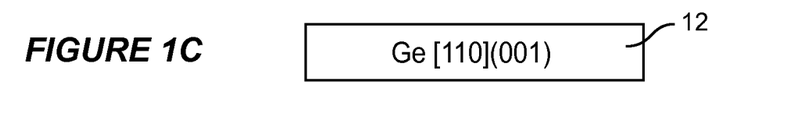
Figure 3:
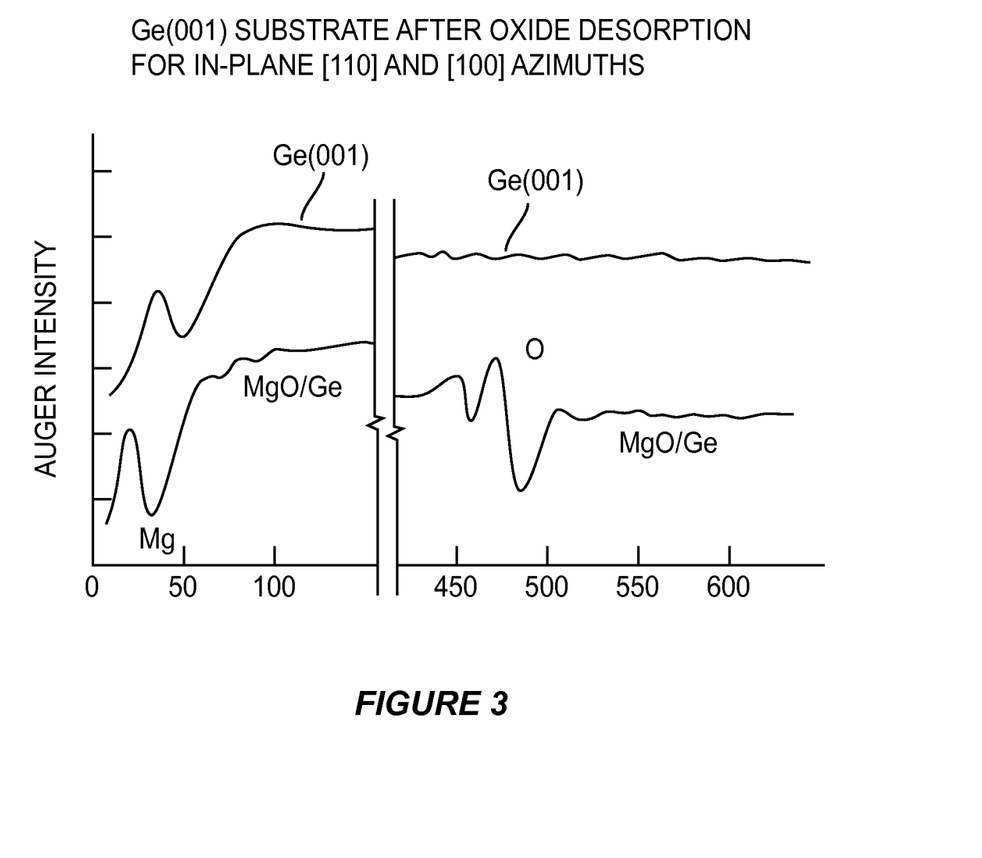
FIG. 3 depicts RHEED patterns of the germanium (001) substrate after oxide desorption for the in-plane [110] and [100] azimuths, and the RHEED pattern for magnesium-oxide on a germanium substrate.

Thereafter, the germanium substrate is annealed at 500° C. for an hour to remove the germanium-oxide. (Act 110, as depicted in FIG. 1(C).) Other temperatures and times may be used to remove the germanium-oxide layer. For example, the annealing temperature may be above 450° C. The time to anneal the germanium substrate to remove the germanium oxide layer may be between 10 minutes and one hour. FIG. 3 shows the RHEED patterns of the germanium (001) substrate after oxide desorption for the in-plane [110] and [100] azimuths. Auger electron spectroscopy after the oxide desorption, depicted in FIG. 3, shows the peak for germanium (52 eV) but no oxygen peak at 505 eV. The lack of a peak for oxygen confirms that the germanium-oxide layer is completely removed.

After annealing the germanium substrate, the temperature of the germanium substrate is brought to between 250° C. and 300° C. (Act 112.) Thereafter, the magnesium-oxide layer 16 is epitaxially grown, via molecular beam epitaxy, on the germanium substrate by molecular beam evaporation of a single crystalline germanium oxide source. (Act 114.) The controlled deposition rate may be between 1.5 Å/minute to 1.7 Å/minute. In some cases, the deposition rate may be between 1 Å/minute up to 2 Å/minute.

During deposition, the temperature of the germanium substrate 12 is typically regulated to between about 250° C. and 300° C. This results in a single crystalline, atomically smooth film of magnesium-oxide 16 on the germanium substrate 12 and a homogenous magnesium-oxide/germanium interface 18. The magnesium-oxide layer 16 is atomically smooth and has a root mean square (RMS) roughness <0.2106 nm, which is the atomic spacing of magnesium-oxide. The deposition rate is monitored by a quartz deposition monitor. The magnesium-oxide layer 16 is grown to a thickness of around 7 nm.

Figure 1D:
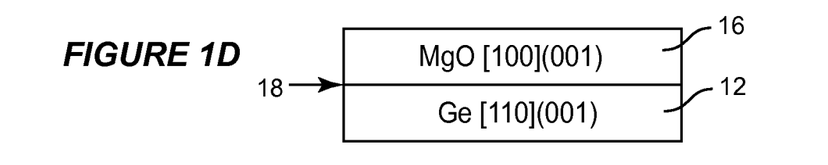
Figure 4:
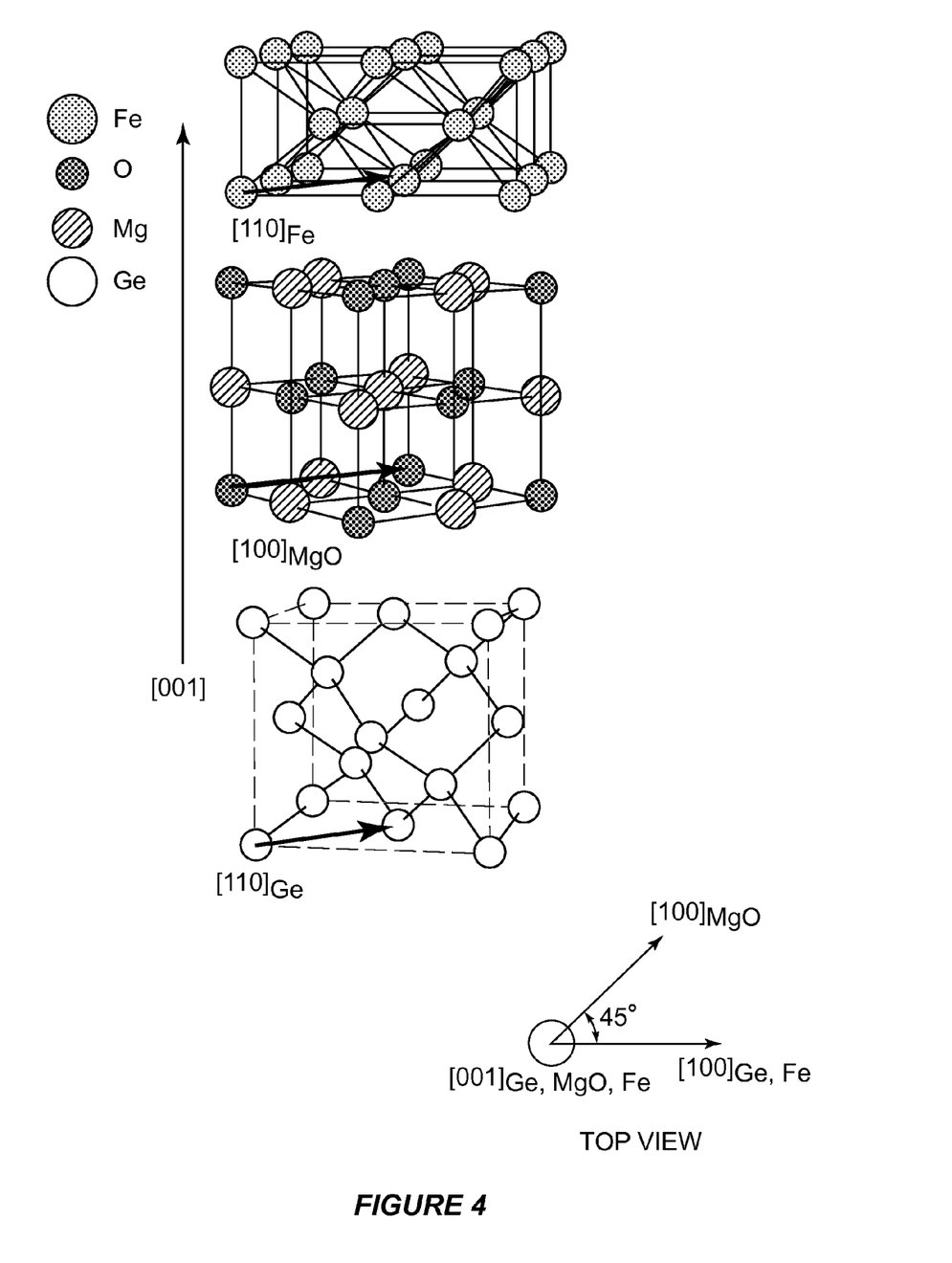
FIG. 4 depicts a magnesium-oxide unit cell at 45 degrees in-plane rotation with respect to the germanium substrate, which results in a lattice mismatch of around 5.5 percent.

As depicted in FIGS. 1(D) and 4, the resulting magnesium-oxide unit cell has a (001) orientation with a 45 degree in-plane rotated with respect to the germanium crystalline structure in the germanium substrate (001). The result of the 45 degree in-plane rotation is a significantly reduced lattice mismatch, where the crystalline structure is MgO [100](001)//Ge [110](001). The measured lattice mismatch between the germanium substrate 12 and the magnesium-oxide layer 16 is around 5.5 percent. The 45 degree in-plane rotation also enhances the symmetry induced spin filtering effect for spin injection devices.

Figure 5:
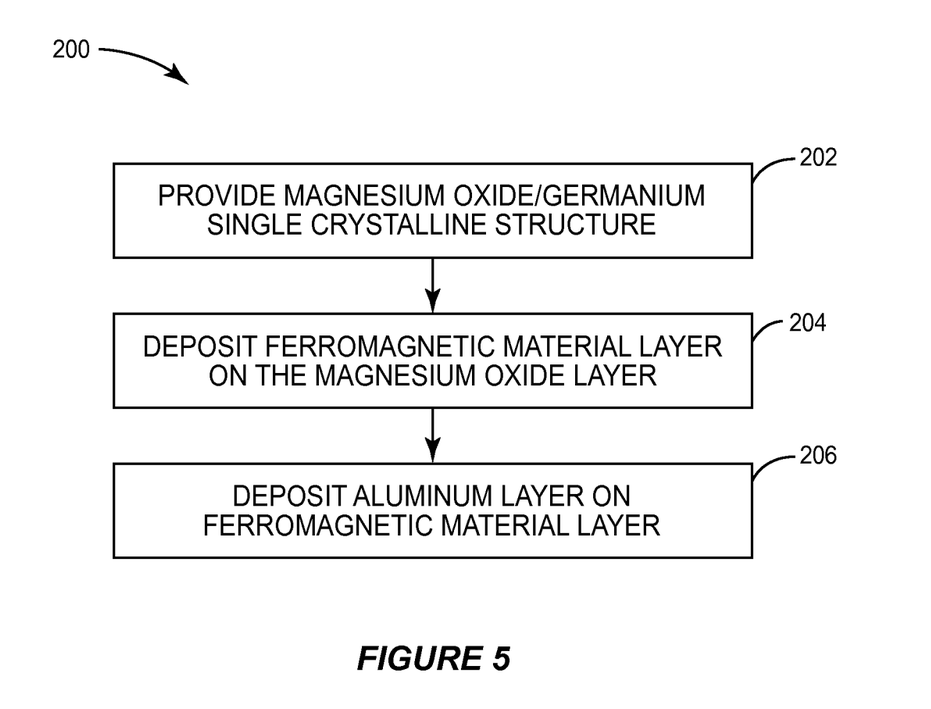
FIG. 5 depicts an example operation to obtain a Fe [001] (001)//MgO [100](001)//Ge[110](001).
Figure 6A:
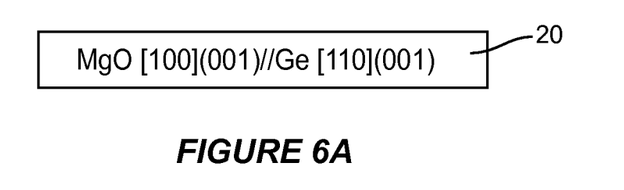
FIG. 6 depicts an example ferromagnetic (FM)/MgO/Ge structure with an outer aluminum protective layer.

FIG. 5 depicts an operation 200 to create a single crystalline heterostructure FE [110](001)//MgO [100](001)//Ge [110](001), as depicted in FIG. 6(A)-(C) and further depicted in FIG. 4. Providing an atomically smooth magnesium-oxide on a germanium substrate with a 45 degree rotation of the magnesium oxide unit cell with respect to that of germanium, where MgO [100](001)//Ge [110](001). The atomically smooth magnesium-oxide on the germanium substrate may be provided by the operation 100, acts 102 through 114, as depicted in FIG. 2. (Act 202.)

Figure 6B:
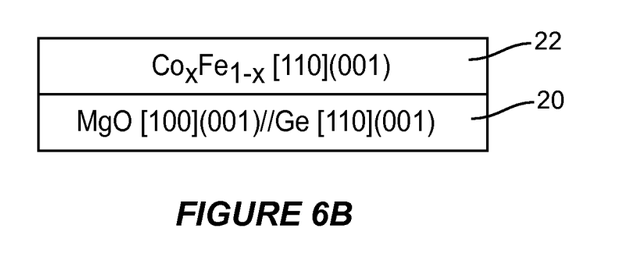

Thereafter, a thermal diffusion cell of the ferromagnetic material is used to deposit a ferromagnetic material on the magnesium-oxide layer to create a ferromagnetic layer 20, as depicted in FIG. 6(B). (Act 204.) The deposition rate is regulated for around 1 Å/minute with a chamber temperature set to between about 180° C. and 200° C. The ferromagnetic layer is grown to a thickness of around 10 nm. In some embodiments, the ferromagnetic layer may be iron (Fe). In other embodiments, the ferromagnetic layer may be cobalt (Co) or an alloy of iron and cobalt ($Co_xFe_{1-x}$).

Figure 6C:
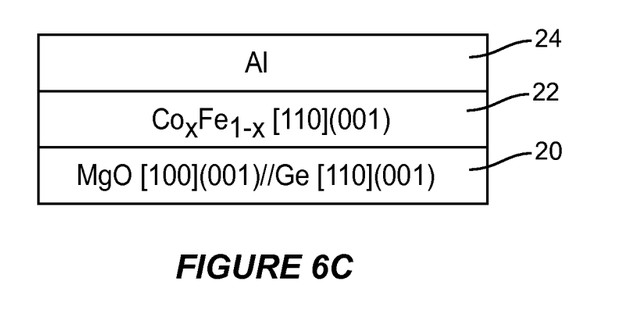

After the ferromagnetic layer is grown, the chamber temperature is cooled to room temperature, which is around 25° C. Using a thermal diffusion cell, an aluminum layer is epitaxially grown on the ferromagnetic layer 20 at room temperature, as depicted in FIG. 6(C) (Act. 206).

Figure 7:
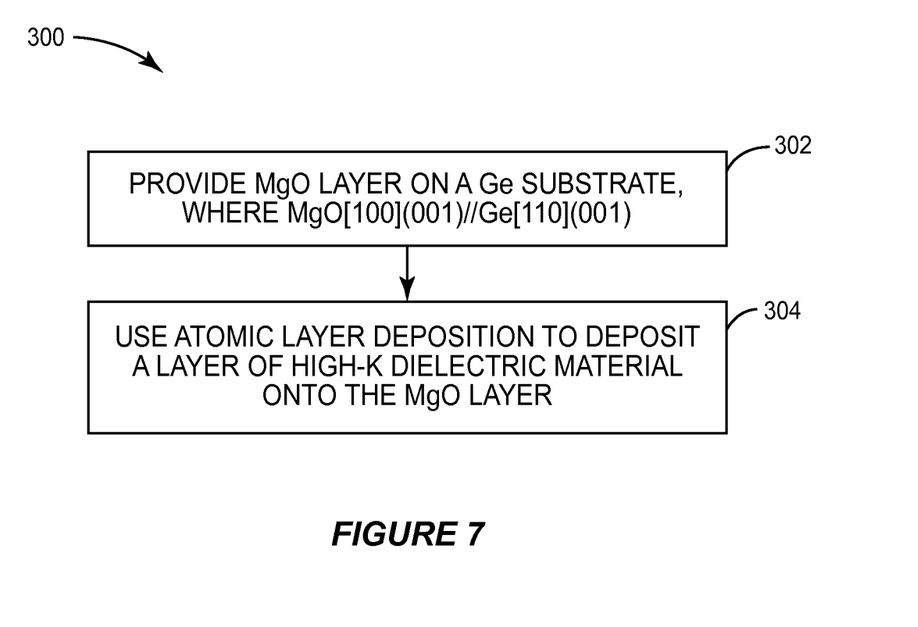
FIG. 7 depicts an example operation to obtain a high-k dielectric/MgO/Ge structure.
Figure 8A:
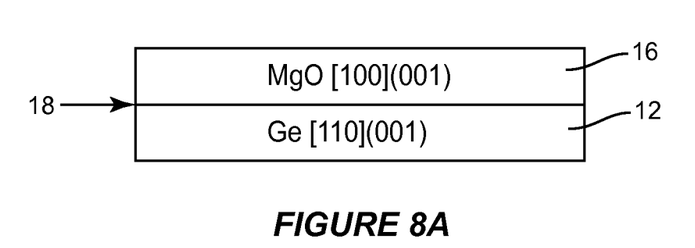
FIG. 8 depicts an example structure obtained in the operation of FIG. 7 to obtain a high-k dielectric/MgO/Ge structure.
Figure 8B:
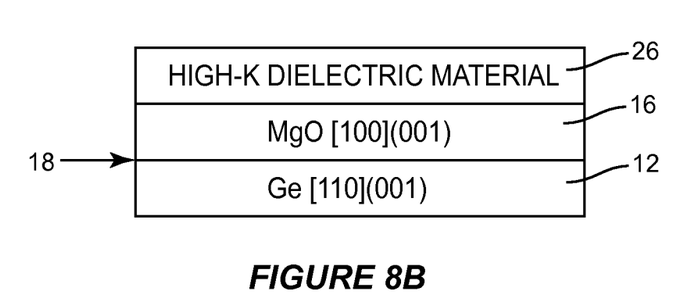

FIG. 7 depicts an operation 300 to create a single crystal heterostructure with a high-k dielectric material//MgO[100] (001)//Ge[110](001), where the magnesium-oxide layer passivates the surface of the germanium substrate, as depicted in FIGS. 8(A)-(B).

First, as depicted in FIG. 8(A), providing an atomically smooth magnesium-oxide on a germanium substrate with a 45 degree rotation of the magnesium-oxide unit cell with respect to the unit cell of germanium. (Act 302) The atomically smooth magnesium-oxide 16 on the germanium substrate 14 may be provided by the operational acts depicted in FIG. 2. As depicted in FIG. 8(A), the atomically smooth magnesium-oxide layer passivates the germanium layer by having a relatively small lattice mismatch of around 5.5 percent.

Second, depositing a high-k dielectric material 26 onto the magnesium-oxide layer 16. (Act 304.) The high-k dielectric material may be deposited onto the magnesium-oxide layer by atomic layer deposition. The high-k dielectric material 26 may be at least one of $HFO_2$, $Al_2O_3$, $ZrO_2$, and $TA_2O_5$. The magnesium-oxide layer 16 on the germanium layer 12 serves as a passivation layer. The magnesium-oxide layer 16 may be between about 5 Å and 10 Å thick. In some applications, the magnesium-oxide layer 16 may be less than 5 Å thick.

Those skilled in the art will recognize improvements and modifications to the embodiments of the present disclosure. All such improvements and modifications are considered within the scope of the concepts disclosed herein and the claims that follow.

What is claimed is:

1. A method for creating a heterostructure comprising:
providing a substrate having a first layer, wherein the first layer includes a substantially single crystalline germanium (Ge);
placing the substrate into a molecular beam epitaxy chamber;
annealing the substrate; and
depositing a second layer onto the substrate by evaporation of a single crystal magnesium-oxide (MgO) source to form the second layer on the substrate, wherein the second layer includes a substantially single crystalline magnesium-oxide, and
wherein the substantially single crystalline magnesium-oxide of the second layer (001) oriented and a unit cell of the subatantially single crystalline magnesium-oxide has a 45° in-plane rotation with respect to a unit cell of germanium(001) in the substrate.

2. The method of claim 1 wherein the first layer and the second layer substantially form an epitaxial relationship of MgO [100](001) // Ge [110](001).

3. The method of claim 1 further comprising:
washing the substrate in isopropyl alcohol; and
successively washing the substrate in dilute NH4OH4, dilute H2SO4, and dilute H2O2.

4. The method of claim 1 wherein annealing the substrate further comprises:
heating the substrate to above about 450° C.

5. The method of claim 1 wherein a deposition rate for magnesium-oxide onto the second layer is between 1 angstroms and 2 angstroms per minute.

6. The method of claim 1 wherein a deposition rate for magnesium-oxide onto the second layer is between 1.5 angstroms and 1.7 angstroms per minute.

7. The method of claim 1 further wherein depositing the second layer onto the substrate by evaporation of the single crystal magnesium-oxide (MgO) source to generate the second layer on the substrate further comprises heating the substrate to a substrate temperature of between 290° C. and about 300° C. during deposition.

8. The method of claim 1 wherein a lattice mismatch between the substantially single crystalline germanium in the first layer and the substantially single crystalline magnesium-oxide in the second layer is less than about 5.5 percent.

9. The method of claim 1 further comprising:
epitaxially depositing a third layer onto the second layer, wherein the third layer includes a ferromagnetic material.

10. The method of claim 9 wherein a thermal diffusion cell of the ferromagnetic material is used to deposit the third layer.

11. The method of claim 9 wherein the ferromagnetic material is a body-centered cubic alloy $Co_xFe_{1-x}$.

12. The method of claim 9 further comprising:
depositing a fourth layer onto the third layer, wherein the fourth layer includes aluminum.

13. The method of claim 1 further comprising:
depositing a third layer onto the second layer, wherein the third layer includes a high-k dielectric material.

14. The method of claim 13 wherein depositing the third layer onto the second layer further comprises:
using atomic layer deposition (ALD) to deposit the third layer onto the second layer.

15. The method of claim 13 wherein the high-k dielectric material includes at least one of HFO2, Al2O3, ZrO2, and TA2O5.

16. The method of claim 13 wherein the second layer is between 5 Å and 10 Å thick.

17. A product made by a process comprising:
providing a substantially single crystalline germanium substrate;
cleaning the substantially single crystalline germanium substrate;
placing the substantially single crystalline germanium substrate into a molecular beam epitaxy chamber;
annealing the substantially single crystalline germanium substrate;
depositing a magnesium-oxide layer onto the substantially single crystalline germanium substrate by molecular beam epitaxy with a substantially single crystalline magnesium-oxide source, wherein magnesium-oxide of the magnesium-oxide layer is(001) oriented and a magnesium-oxide unit cell has a 45° in-plane rotation with respect to a unit cell of germanium (001) in the substantially single crystalline germanium substrate.

18. The product made by the process of claim 17 depositing the magnesium-oxide layer onto the substantially single crystalline germanium substrate by molecular beam epitaxy with the substantially single crystalline magnesium-oxide source further comprises:
heating the substantially single crystalline germanium substrate to between 250° C. and 300° C.

19. The product made by the process of claim 17 wherein annealing the substantially single crystalline germanium substrate comprises:
heating the substantially single crystalline germanium substrate to at least 450° C.

20. The product made by the process of claim 17 wherein a deposition rate for the magnesium-oxide layer is about 1.5 angstroms per minute.

21. The product made by the process of claim 17 further comprising:
depositing a ferromagnetic layer onto the magnesium-oxide layer.

22. The product may by the process of claim 21 wherein a deposition rate for the ferromagnetic layer is about 1.0 angstroms per minute.

23. The product made by the process of claim 17 wherein cleaning the substantially single crystalline germanium substrate comprises successively washing the substantially single crystalline germanium substrate in dilute NH4OH4, dilute H2SO4, and dilute H2O2.

24. The product made by the process of claim 23 wherein cleaning the substantially single crystalline germanium substrate further comprises initially washing the substantially single crystalline germanium substrate with isopropyl alcohol.

25. The product made by the process of claim 17 wherein relevant surface lattice constants are a * Fe substantially equal to about 0.4055 nm, a * MgO is substantially equal to about 0.4212 nm, and a * Ge is substantially equal to about 0.3992 nm, where is substantially equal to about 0.2867 nm, is substantially equal to about 0.4212 nm, and is substantially equal to about 0.5646 nm.

26. The product may by the process of claim 17 further comprising:
using atomic layer deposition (ALD) to deposit a high-k dielectric material layer on to the magnesium-oxide layer.

27. The product made by the process of claim 26 wherein the high-k dielectric material layer includes at least one of HFO2, Al2O3, ZrO2, and TA2O5.

28. The product made by the process of claim 17 where the magnesium-oxide layer is less than about 10Å thick.

29. A semiconductor wafer comprising:
a substantially single crystalline germanium substrate (001);
a substantially single crystalline magnesium-oxide layer (001) disposed on the substantially single crystalline germanium substrate, wherein a unit cell of the substantially single crystalline magnesium-oxide layer is rotated 45 degrees with respect to a unit cell of the substantially single crystalline germanium substrate.

30. The semiconductor wafer of claim 29 further comprising:
a substantially single crystalline ferromagnetic material (FE) layer disposed onto the substantially single crystalline magnesium-oxide layer, wherein an epitaxial relationship is substantially FE [110](001)//MgO [100] (001)//Ge [110](001).

31. The semiconductor wafer of claim 30 wherein the substantially single crystalline ferromagnetic material (FE) layer is composed of an alloy $Co_xF_{1-x}$.

32. The semiconductor wafer of claim 29 further comprising:
a high-k dielectric material disposed onto the substantially single crystalline magnesium-oxide layer.

33. The semiconductor wafer of claim 32 wherein the substantially single crystalline magnesium-oxide layer is less than about 10Å thick.

34. The semiconductor wafer of claim 33, wherein the high-k dielectric material includes at least one of HFO2, Al2O3, ZrO2, and TA2O5.

* * * * *

UNITED STATES PATENT AND TRADEMARK OFFICE
CERTIFICATE OF CORRECTION

PATENT NO. : 8,766,341 B2  
APPLICATION NO. : 12/905675  
DATED : July 1, 2014  
INVENTOR(S) : Wei Han et al.

Page 1 of 1

It is certified that error appears in the above-identified patent and that said Letters Patent is hereby corrected as shown below:

IN THE CLAIMS

In claim 1, in column 6, at line 15 replace:

"the subatantially single crystalline magnesium-oxide" with --the substantially single crystalline magnesium-oxide--.

In claim 7, in column 6, at lines 39 and 40 replace:

"temperature of between 290° C. and about 300° C. during deposition." with --temperature of between 290 C. and 300 C. during deposition.--.

In claim 25, in column 8, at lines 1-7 replace:

"The product made by the process of claim 17 wherein relevant surface lattice constants are a *Fe substantially equal to about 0.4055 nm, a*MgO is substantially equal to about 0.4212 nm, and a*Ge is substantially equal to about 0.3992 nm,where  is substantially equal to about 0.2867 nm,  is substantially equal to about 0.4212 nm, and is substantially equal to about 0.5646 nm." with --The product made by the process of claim 17 wherein relevant surface lattice constants are a*.sub.Fe substantially equal to about 0.4055 nm, a*.sub.MgO is substantially equal to about 0.4212 nm, and a*.sub.Ge is substantially equal to about 0.3992 nm, where a.sub.Fe is substantially equal to about 0.2867 nm, a.sub.MgO is substantially equal to about 0.4212 nm, and a.sub.Ge is substantially equal to about 0.5646 nm.--.

Signed and Sealed this  
Eleventh Day of August, 2015

Michelle K. Lee  
*Director of the United States Patent and Trademark Office*